US006459153B1

(12) United States Patent
Sengupta

(10) Patent No.: US 6,459,153 B1
(45) Date of Patent: *Oct. 1, 2002

(54) COMPOSITIONS FOR IMPROVING INTERCONNECT METALLIZATION PERFORMANCE IN INTEGRATED CIRCUITS

(75) Inventor: Samit S. Sengupta, San Jose, CA (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/310,875

(22) Filed: May 12, 1999

(51) Int. Cl.$^7$ ............................................. H01L 23/48
(52) U.S. Cl. ..................... 257/758; 257/762; 257/765
(58) Field of Search .............................. 257/758, 762, 257/767, 771, 772, 766, 765; 438/622, 687

(56) References Cited

U.S. PATENT DOCUMENTS

| 4,650,528 A | * | 3/1987 | Masumoto et al. | 148/437 |
| 4,711,762 A | * | 12/1987 | Vernam et al. | 420/532 |
| 6,020,269 A | * | 2/2000 | Wang et al. | 438/717 |
| 6,107,208 A | * | 8/2000 | Cheng et al. | 438/724 |

FOREIGN PATENT DOCUMENTS

| JP | 2-42747 | * | 2/1990 |

OTHER PUBLICATIONS

Skala and Bothra, "Effects of W–Plug Via Arrangement on Electromigration Lifetime of Wide Line Interconnects", Jun. 1–3, 1998 IITC Conf., San Francisco, CA, IEEE Electron Devices Society.

I.A. Blech, "Electromigration in thin aluminum films on titanium nitride", 4–4–76, Journal of Applied Physics, vol. 47, No. 4, © American Inst. Of Physics.

Schreiber, "Electromigration Threshold in Aluminum Films", Rev. 9–18–84, Solid–State Electronics, vol. 28, No. 6, pp. 617–626, 1985.

Hu, Rodbell, Sullivan, Lee and Bouldin, "Electromigration and stress–induced voiding in fine Al and Al–alloy thin–film lines", 7–4–95, IBM J. RES. Develop., vol. 39, No. 4, pp. 465–497.

* cited by examiner

Primary Examiner—Steven Loke
Assistant Examiner—Hung Kim Vu
(74) Attorney, Agent, or Firm—Peter Zawilski

(57) ABSTRACT

A semiconductor device includes a substrate and a plurality of interconnect metallization lines defined over the substrate, each interconnect metallization line being provided with an electromigration-impeding composition including a percentage by weight of aluminum, a percentage by weight of copper, and a percentage by weight of zinc. The percentage by weight of zinc may be less than about 4 in solid solution in Al at 100 degrees C, which is a substantial increase in the Zn content over the about 0.5 weight percent of the Cu content in previously-used Al—Cu alloys. The percentage by weight of Zn may preferably range between about 1 and 2. The electromigration-impeding composition of the lines may include a structure of a solid solution of Al and Zn in the form of grains. The grains are bounded by grain boundaries. The structure further includes a precipitate of Al and Cu defined in the grain boundaries. Electromigration of the Al from the grain boundaries occurs and tends to cause the Al to electromigrate from the grains. The percentage by weight of Zn is selected to both define the solid solution with Al and to impede the electromigration of the Al from the grains. A method of making an interconnect metallization layer on a substrate includes depositing a metallization composition on the substrate, wherein the composition is the above-described composition.

15 Claims, 5 Drawing Sheets

COMPOSITIONS FOR IMPROVING INTERCONNECT METALLIZATION PERFORMANCE IN INTEGRATED CIRCUITS

BACKGROUND OF THE INVENTION

1. Field of the Invention

The present invention relates to the manufacture of semiconductor devices. More particularly, the present invention relates to techniques for improving interconnect metallization performance in integrated circuits.

2. Description of the Related Art

In the manufacture of semiconductor integrated circuits ("ICs"), well-known metallization techniques are used to interconnect devices on different levels of an IC chip. Generally, the performance of the interconnect metallization, or metallization line, ("metallization performance") involves providing proper conductivity, ease of etching of the interconnect material, minimizing electromigration, and minimizing capital investment and developmental effort in the metallization process.

Thus, in the design of any IC, strong consideration is generally placed on examining the degree of expected electromigration that may occur in view of a metallization line's current carrying requirements. This is typically required because designers know that if too much electromigration occurs in a given metallization line having a particular width, serious reliability-impacting voids may form. Accordingly, designers are commonly required to increase a metallization line's width when high levels of current are anticipated, such as, for example, in power and ground bus lines. In certain circumstances, the designer is forced to make particular metallization lines exceedingly wide, just to prevent the possibility of excessive voiding from occurring. Widening metallization lines does, however, impose a cost penalty since this will require semiconductor chips to be larger than may be necessary to carry out the IC's designed function.

Electromigration is commonly understood to be the result of an average current flow through a conductor. The flowing electrons transfer a fraction of their momentum to the metal atoms from a scattering process. This momentum transfer in turn causes a movement of the metal atoms (i.e., mass transfer) in the direction of electron flow. Therefore, the amount of momentum transfer, and resulting metal flow, increases with increasing current density. This flow of material is seldom uniform and regions of tensile stress develop where there is a net loss of material over time and regions of compressive stress develop where there is a net increase of material over time. The development of regions of tensile and compressive stress therefore create stress gradients. These stress gradients also cause a flow of metal since stress drives a flow of atoms from regions of high concentration (i.e., compressive stress) to regions of low concentration (i.e., tensile stress). For more information on electromigration and the degrading effects of electromigration, reference may be made to an article entitled "Effects of W-Plug Via Arrangement on Electromigration Lifetime of Wide Line Interconnects," by S. Skala and S. Bothra, Proceedings of the International Interconnect Technology Conference, San Francisco, Calif., June (1998). This article is hereby incorporated by reference.

Electromigration voids are most commonly formed at the beginning of an interconnect line. This is believed to occur because electromigration degradation is more likely to stop when the sum of electromigration and stress is zero, which will more likely occur at the end of a line. Early observations of electromigration flow and its tendency to stop when a line is relatively short (e.g., a short distance to its terminating end) and continue when a line is relatively long (e.g., a long distance to its terminating end), was first reported by I. A. Blech. The behavior of electromigration defined in terms of the length of a metallization line has thus become widely referred to as the "Blech effect." That is, when a metallization line is at least as short as a given Blech length for a particular width, electromigration voids will no longer form. For more information on Blech effect and Blech length, reference may be made to an article entitled "Electromigration and Stress-Induced Voiding in Fine Al and Al-alloy Thin-Film Lines" by C. K. Hu, K. P. Rodbell, T. D. Sullivan, K. Y. Lee and D. P. Bouldin, IBM Journal of Research and Development, Vol. 39, No. 4, July 1995, pp. 465–497. This article is hereby incorporated by reference.

Although the Blech length has been widely known, this concept is generally not applicable for many interconnect metallization lines and power buses because such lines are generally required to be longer than the Blech length in order to meet functional specifications. As a result, designers have continued to design certain metallization lines wider than necessary in order to prevent void formation which may introduce open circuits or complete functional failures.

Al—Cu alloys are one type of composition used for metallization lines in multi-level metallization for IC fabrication. However, if too much Cu is used in the alloy, the conductivity of the alloy decreases and it is more difficult to etch the alloy. At the other extreme, although pure Cu can be deposited with a dual damascene process, significant capital investment and developmental effort are required to provide pure Cu metallization in this manner. Pending reduction of such capital and developmental investment, efforts have been made to obtain improved metallization performance using Al-based alloys.

The Al—Cu alloy follows the classic solvus curve in which the solid solution of Al and Cu occurs at low weight percentages of Cu. Thus, the Cu appears primarily inside the grains of Al at such low weight percents of Cu, such that the grains are predominately composed of Al. At higher weight percents of Cu, the alloy composition shifts to the right of the solvus curve. The excess Cu now segregates to the grain boundaries between grains, in the form of Al—Cu precipitates.

In prior attempts to use Al—Cu alloys for improving interconnect metallization, Cu depletion from grain boundaries is a problem. This problem is schematically shown in FIG. 1A, where a magnified portion of an interconnect metallization 20 is shown including grains 21 (primarily of Al) separated by grain boundaries 22 (primarily of the precipitate $Al_2Cu$). The grains 21 may be large as shown by grains 21L or may be small as shown by grains 21s. Electrical current is conducted through the interconnect metallization 20, and electron flow is depicted by a reference arrow $e^-$. Arrows E represent the electrons flowing between two adjacent grains 21 along a grain boundary 22. At the onset of electromigration, the electrons $e^-$ initially carry atoms Cu, which are shown by dots and tiny circles in the grain boundary 22. The atoms migrating between exemplary grains 21-1 and 21-2 are shown diverging, which causes a net loss of material over time as the atoms migrate toward a group of the small grains 21s. As the atoms migrate to the right past the group of small grains 21s, they converge and accumulate as shown by the reference number 23, such that there is a net increase of material over time. The large grains 21L, which may grow depending on thermal history, can block flux along the interconnect metallization, and create flux divergence and voiding at the Cu-rich phase. Although proper heat treatment has been proposed as a solution to the goal of optimization of theta phase morphology, thermal cycles in backend fabrication processing and restrictions on elevated temperature processing preclude use of such proper heat treatment.

In more detail, FIGS. 1B and 1C show a magnified portion of FIG. 1A illustrating opposed grains 21 (e.g., grains 21-1 and 21-2) separated by the grain boundary 22. Arrows $C_U$ depict Cu atoms migrating away from the grain boundary 22 under the action of the electron $e^-$flow, resulting in Cu depletion from the grain boundary 22. Because the Cu atoms are heavier than the Al atoms, there is a time period ("incubation time", or $\Delta t$; FIG. 5) during which the Cu atoms resist being moved by the electron $e^-$flow. Then, once the Cu atoms have been depleted along a length equal to the critical length '1c' from the grain boundary 22, the Al atoms begin to move away from the grain boundary 22 by the same electromigration process. However, the migration of the Al atoms is rapid. As a result, the Cu and Al atoms migrate to the end of the interconnect metallization 20, and as described above, may result in Al failure, which is a failure of the metallization 20. Such failure can be a serious problem where a void is formed just below a via. This, of course, can cause the entire IC device to fail working within the design specifications. As such, electromigration failures can be early in the life of the IC or may result after a period of use.

As mentioned above, a more important aspect of electromigration is that Al migration occurs not only from within the grain boundaries 22 upon Cu depletion from the grain boundaries, but also from the grains 21 adjacent to the grain boundaries 22. FIG. 1C shows a case where the Cu migration is followed by the rapid Al migration. Because the Al—Cu solvus curve indicates that there is very little Cu in solid solution within the Al, the very low weight percent of Cu in the grains 22 is not effective to prevent, or delay, the migration of the Al atoms from the grains 21 into the grain boundaries 22, such that voids 24 are formed in the grains 21. The voids 24 cause the Al—Cu alloy to have increased resistance, which decreases the performance of the devices, and can result in the failure of the IC.

In view of the foregoing, there is a need for an improved interconnect metallization alloy composition, and for methods for improving interconnect metallization performance, whereby the rapid onset of Al failure due to Al migration from the grains is significantly delayed, as compared to that occurring in Al—Cu alloys.

SUMMARY OF THE INVENTION

Broadly speaking, the present invention fills these needs by providing an improved composition in the form of an Al—Cu—Zn alloy for interconnect metallization, and methods for providing an Al—Cu—Zn alloy for interconnect metallization. The invention also fills the need for reducing the effects of Cu depletion from grain boundaries (and the resulting rapid onset of Al failure) by providing grains in an interconnect metallization that are a Zn-rich Al—Zn alloy. Thus, early electromigration failure is reduced. It should be appreciated that the present invention can be implemented in numerous ways, including as a process, a composition, or a method. Several inventive embodiments of the present invention are described below.

In one embodiment, a semiconductor device is described as including a substrate and a plurality of interconnect metallization lines defined over the substrate. Each of the interconnect metallization lines is provided with an electromigration-impeding composition including a percentage by weight of aluminum, a percentage by weight of copper, and a percentage by weight of zinc. In more detail, the percentage by weight of zinc may be less than about 4 in solid solution in Al at 100 degrees C., which is a substantial increase in the Zn content over the about 0.5 weight percent of the Cu content in Al—Cu alloys. As an example, the percentage by weight of Zn may range between about 1 and 2. In a more detailed embodiment, the lines may have an electromigration-impeding composition including a solid solution of Al and Zn, wherein the solid solution is in the form of grains, and the grains are bounded by grain boundaries. The composition further includes a precipitate of Al and Cu defined in the grain boundaries. Electromigration of the Al from the grain boundaries occurs and tends to cause the Al to electromigrate from the grains. The percentage by weight of Zn is selected to both define the solid solution with Al and to impede the electromigration of the Al from the grains.

In another embodiment, a method of making an interconnect metallization layer over a substrate is described as including depositing a metallization composition over the substrate. The composition includes an Al component, a Cu component, and a Zn component. Of course, the composition can also include trace impurities such as oxygen, iron, nickel, etc. The percentage by weight of the Zn component is less than about 4, and preferably ranges between about 1 and 2 percent by weight.

In yet another embodiment, a semiconductor device having improved interconnect metallization performance is described as including at least one metallization layer, the metallization layer having grains bounded by grain boundaries. The grains include a solid solution of predominantly Al and Zn and the grain boundaries include a precipitate of predominantly Al and Cu such that electromigration tends to deplete the Al from the grain boundaries and tends to cause migration of the Al from the grains. The Zn is effective to improve interconnect metallization performance by impeding the migration of the Al from the grains. The layer includes a percentage by weight of the Al; a percentage by weight of the Cu; and a percentage by weight of the Zn. The percentage by weight of Zn is less than about 4, such as a percentage by weight of Zn ranging between about 1 and 2. The percentage by weight of the Zn is selected to both define the solid solution with Al and to impede the electromigration of the Al from the grains without substantially increasing the resistivity of the metallization layer.

In the use of the Al—Cu—Zn alloy as a metallization layer for interconnect metallization, the Al—Cu—Zn alloy with the Zn in solid solution exhibits improved reliability. The presence of the larger, heavier Zn atoms delays the migration of the Al from the bulk grains into the grain boundaries. Any depletion of the Al existing within the grain boundaries would occur notwithstanding the Zn in the alloy, but such depletion is not significant enough to cause voiding. Studies indicate that a high percentage (e.g., 2 weight percent) of Zn in the Al—Cu—Zn alloy remains in solid solution in the grains, such that the Al—Cu—Zn alloy maintains superior electromigration resistance independently of the history of heat treatment. In addition, the Zn added to the Al—Cu alloy improves the mechanical strength of the interconnect metallization layers, and hence the reliability of the interconnects. Also, the Al—Cu—Zn alloy as a metallization layer for interconnects can be fabricated without a significant reduction in conductivity as compared to the Al—Cu alloy. These benefits result while reducing the negative impacts on ease of etching. For example, sputtering during etching can be used to remove excess Zn, although in some cases the addition of Zn to the Al—Cu alloy may require slightly more sputtering at higher power to remove the Zn residue.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for an improved composition in the form of an Al—Cu—Zn alloy for interconnect metallization, and methods providing an Al—Cu—Zn alloy for interconnect metallization are disclosed. Also disclosed is a semiconductor device having improved interconnect metallization performance. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to obscure the present invention.

Figure 2:
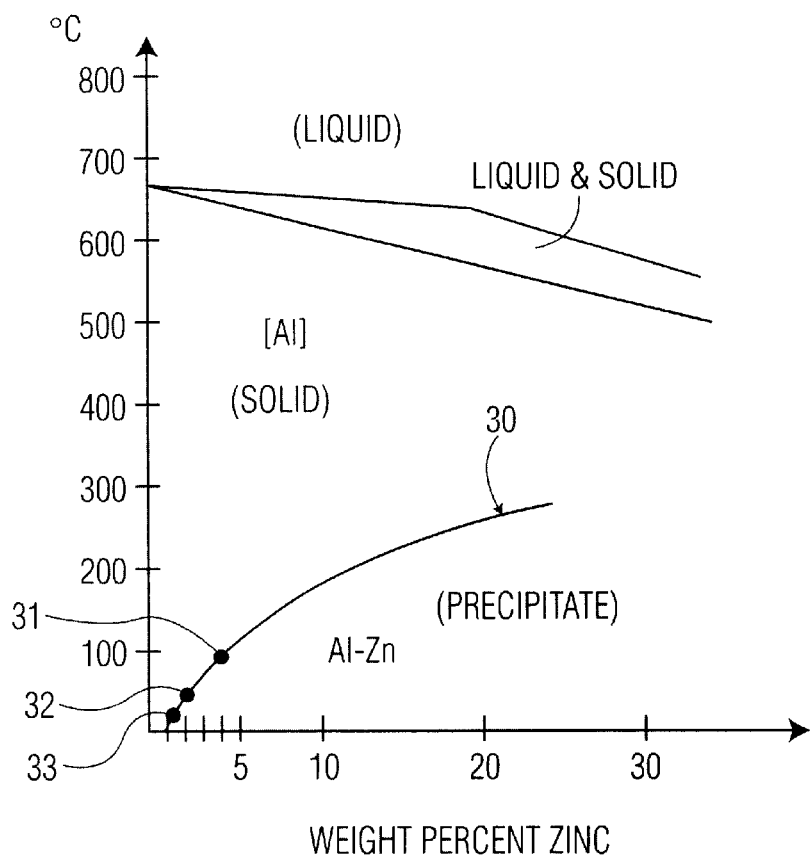
FIG. 2 is a phase diagram showing the relation of temperature and phase of an alloy with respect to the weight percentage of the alloy constituents, wherein a solvus curve for an Al—Zn alloy that illustrates a relatively wide range of Zn in solid solution with Al (as compared to a narrow range of Cu in solid solution with Al in an Al—Cu alloy).

FIG. 2 illustrates a phase diagram for an Al—Zn alloy portion of the Al—Cu—Zn alloy of the present invention. A solvus curve 30 having points 31, 32 and 33 indicates that for various temperatures (e.g., from about 0 degrees C. to about 200 degrees C.) there is a relatively wide range of Zn (e.g., from about 2 weight percentage to about 12 weight percentage) in solid solution with Al. This compares to an Al—Cu alloy where, for various temperatures (e.g., from about 20 degrees C. to about 400 degrees C.), there is a relatively narrow range of Cu (e.g., from about 0.2 weight percentage to about 2 weight percentage) in solid solution with Al.

The Al-based alloy of the present invention is an Al—Cu—Zn alloy. As indicated in FIG. 2, and as shown in more detail in FIG. 3, the Zn is retained inside grains 36 of Al at such relatively high weight percents of Zn. In a preferred embodiment, the weight percentage of Zn in the alloy is up to about 4 weight percentage, such that the grains 36 are composed of Al and significant amounts of Zn. In a more preferred embodiment, the weight percentage Zn in the alloy is in the range of 1 to 2 weight percentage, and the weight percentage of Cu is about 0.5±0.4. In some cases, the weight percentage of Cu used by some fabrication houses can be up to about 1 weight percentage of Cu or more.

Figure 3:
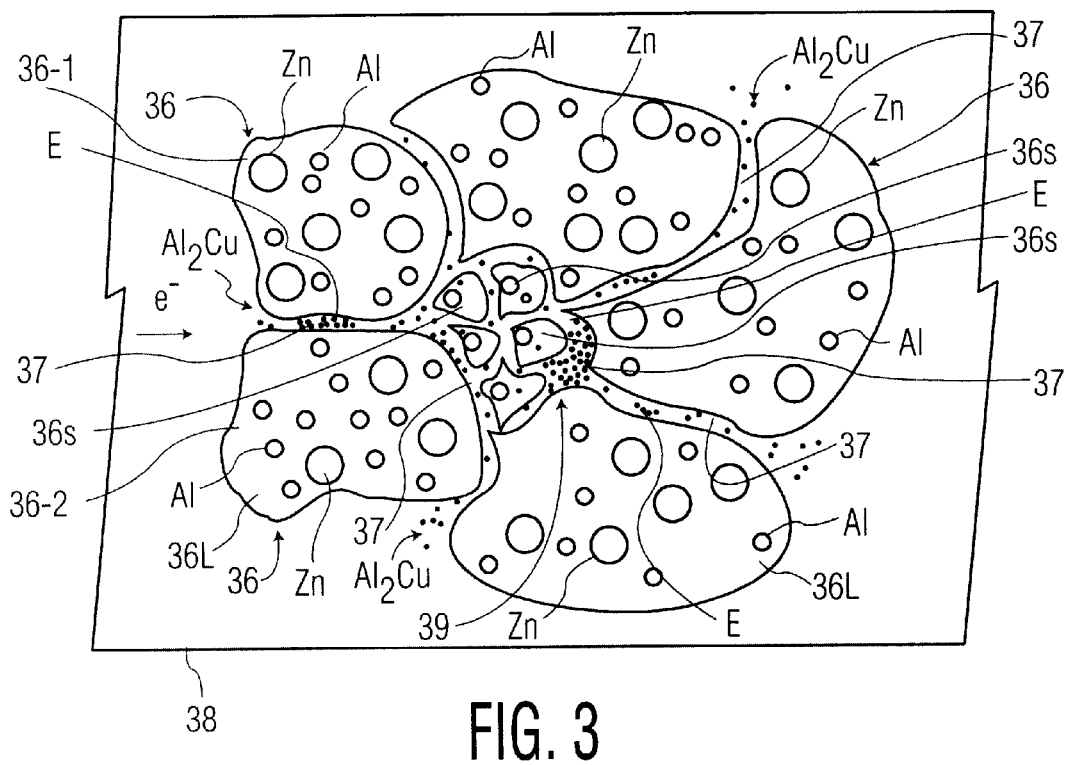
FIG. 3 shows a magnified portion of an interconnect metallization of the present invention having grains and grain boundaries.
Figure 4:
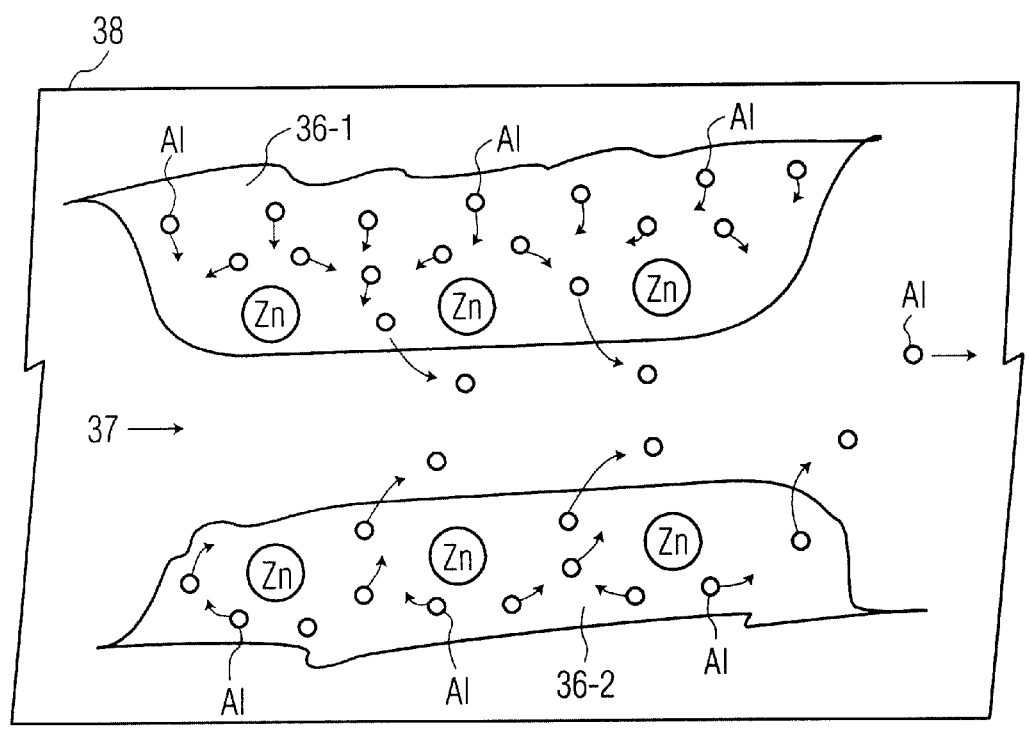
FIG. 4 illustrates a more magnified portion of the grains and grain boundaries of the interconnect metallization of the present invention, showing Zn atoms delaying electromigration of Al atoms from the grains.
Figure 7:
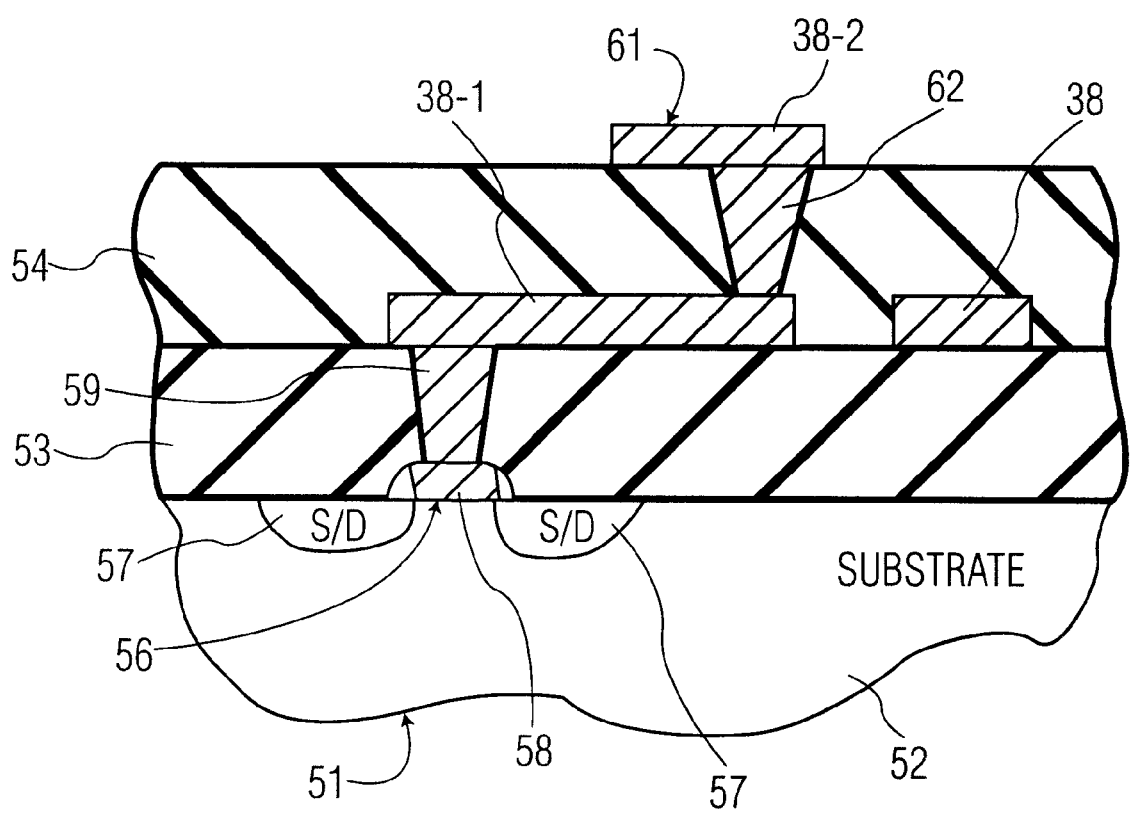
FIG. 7 illustrates a cross section of a representative semiconductor device having interconnect metallization lines fabricated from the Al—Cu—Zn alloy of the present invention, wherein the lines define a metallization network, including a conductive via and a conductive contact.

Grain boundaries 37 are shown in FIGS. 3 and 4, and primarily include the precipitate $Al_2Cu$. The grains 36 may be large as shown by grains 36L or may be small as shown by grains 36s. The grains 36 and the grain boundaries 37 are part of an interconnect metallization, e.g., an interconnect metallization line 38 (FIGS. 3 and 7).

The electron flow of electrical current conducted through the interconnect metallization 38 is depicted by a reference arrow $e^-$. Arrows E represent the electrons flowing between two adjacent grains 36-1 and 36-2 along a grain boundary 37. By electromigration, the electrons $e^-$ carry atoms of Cu and Al through the grain boundary 37, which atoms are shown by dots. The atoms migrating to the right between grains 36-1 and 36-2 are shown diverging and being more spaced from each other as they approach a group of small grains 36s. As the atoms migrate to the right past the group of small grains 36s, they converge and accumulate as shown by the reference number 39.

Figure 5:
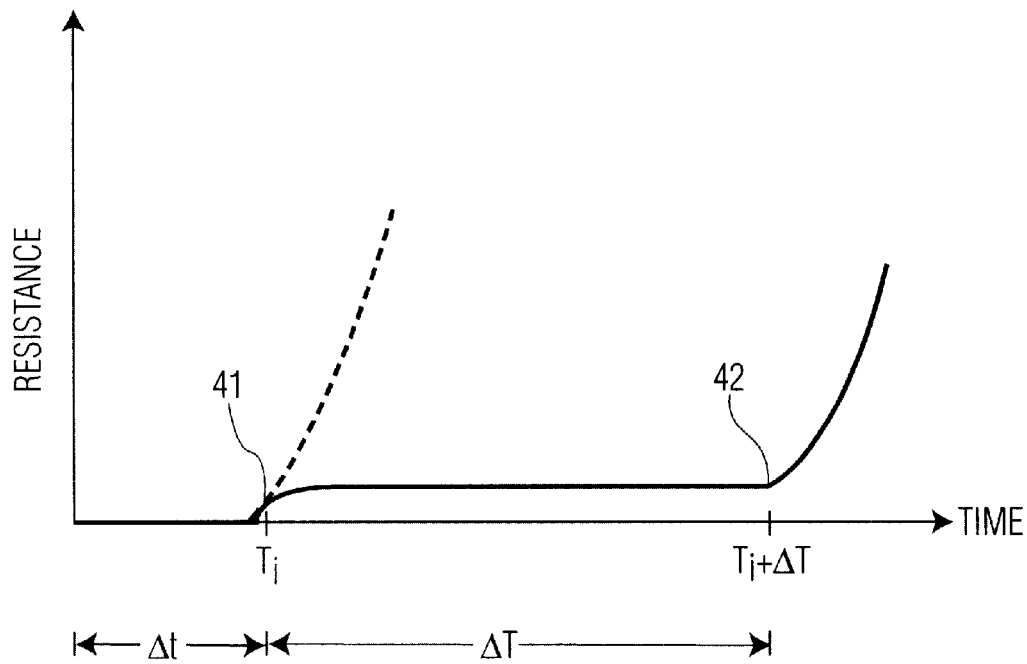
FIG. 5 is a graph of resistance vs. time illustrating the delay delta T in the significant migration of Al atoms from the grains of the interconnect metallization of the present invention.

FIG. 4 shows a more magnified portion of FIG. 3 illustrating opposed grains 36 (e.g., grains 36-1 and 36-2) separated by the grain boundary 37. Depletion of Cu atoms from the grain boundary 37 as a result of electromigration has taken place under the action of the electron flow. As shown in FIG. 5, because the Cu atoms are heavier than the Al atoms, there is a time period ("incubation time", or delta t) during which the Cu atoms resist being moved by the electron flow. Once the Cu atoms are depleted from the grain boundary 37, the Al atoms begin to electromigrate, along the grain boundary 37 by the same electromigration process. To reflect this movement, FIG. 4 shows the grain boundary 37 substantially depleted of Al and Cu atoms. FIG. 5 shows that the incubation time delta T is many times longer than the incubation time delta t for the Al—Cu alloy, for example. After the incubation time delta t there is a knee 41 in the curve of the graph for the Al—Cu alloy indicating that the resistance of the prior art line 20 increases sharply. After the incubation time delta T there is a knee 42 in the curve of the graph for the Al—Cu—Zn alloy. The knee 41 is spaced from the knee 42 by the incubation time delta T, indicating that in a semiconductor device having metallization lines 38 fabricated from the Al—Cu—Zn alloy, there is a substantial delay in the formation of the voids 21 (due to electromigration), which delays the occurrence of increased resistance of the interconnect metallization, and thus delays a decrease in the performance of the interconnect metallization. This also delays the resulting failure of the IC. As an example, the incubation time delta T may be one to three times longer than Δt, which may effectively double or quadruple the life of the IC.

Figure 1A:
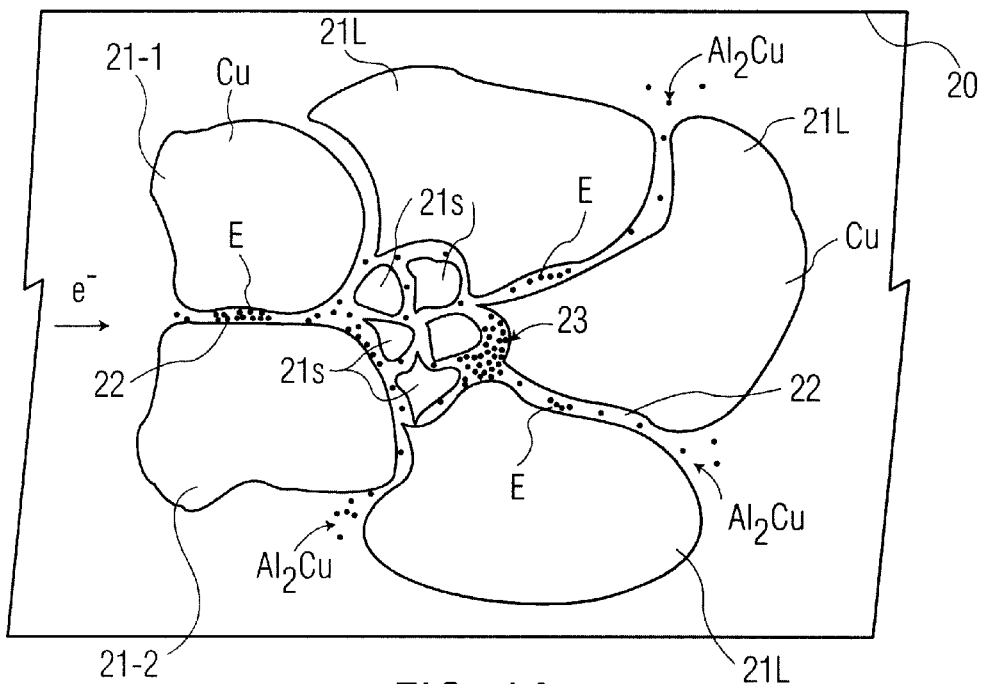
FIG. 1A shows a simplified and magnified portion of a prior art interconnect metallization having grains and grain boundaries.
Figure 1B:
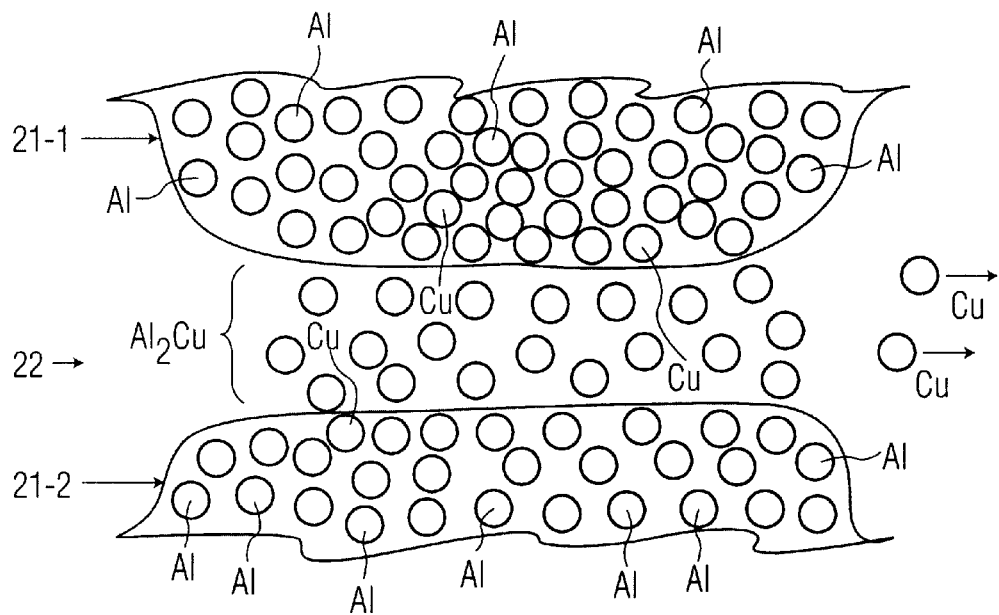
FIG. 1B illustrates a more magnified portion of the grains and grain boundaries of the prior art interconnect metallization, showing electromigration of Cu atoms and Al atoms from the grain boundaries.
Figure 1C:
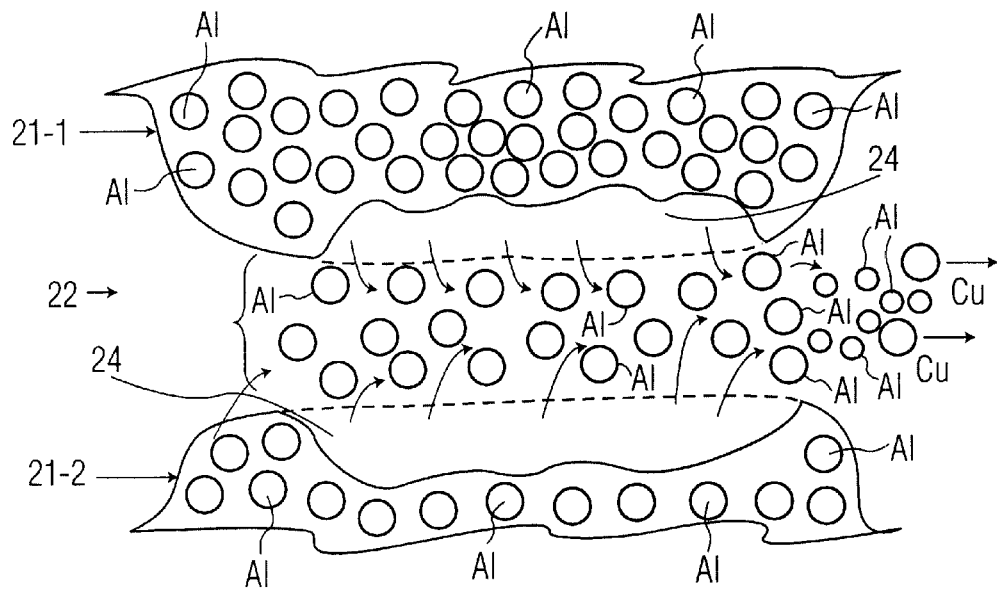
FIG. 1C illustrates a more magnified portion of the grains and grain boundaries of the prior art interconnect metallization, showing electromigration of Al atoms from the grains, and creating voids in the grains.

Although the migration of the Al atoms from the grain boundary 37 may be rapid, and although in the prior art Al—Cu alloy after a short operational life there would be a resulting Al failure due to rapid migration of the atoms from the grains 36, the presence of the Zn in the grains 36 avoids such problem of the Al—Cu alloy. In particular, there are the substantial amounts of Zn atoms shown in FIG. 4 within the grains 36 because the Al—Zn solvus curve 30 (FIG. 2) indicates that there is up to 4 weight percentage of Zn in solid solution with the Al at 100 degrees C. FIG. 4 shows that the atoms of Zn (in the relatively high weight percent of Zn in the grains 36) impede the migration of the Al from the grains 36. In detail, the Zn atoms impede the Al atoms from direct migration into the grain boundaries 37 and substantially delay the migration of the Al atoms from the grains 36 into the grain boundaries 37. The formation of voids 24 (FIG. 1C) in the grains 36 is thus delayed by the incubation time delta T of the Zn. Such delay can substantially improve the lifetime of the interconnect metallization 38.

Figure 6:
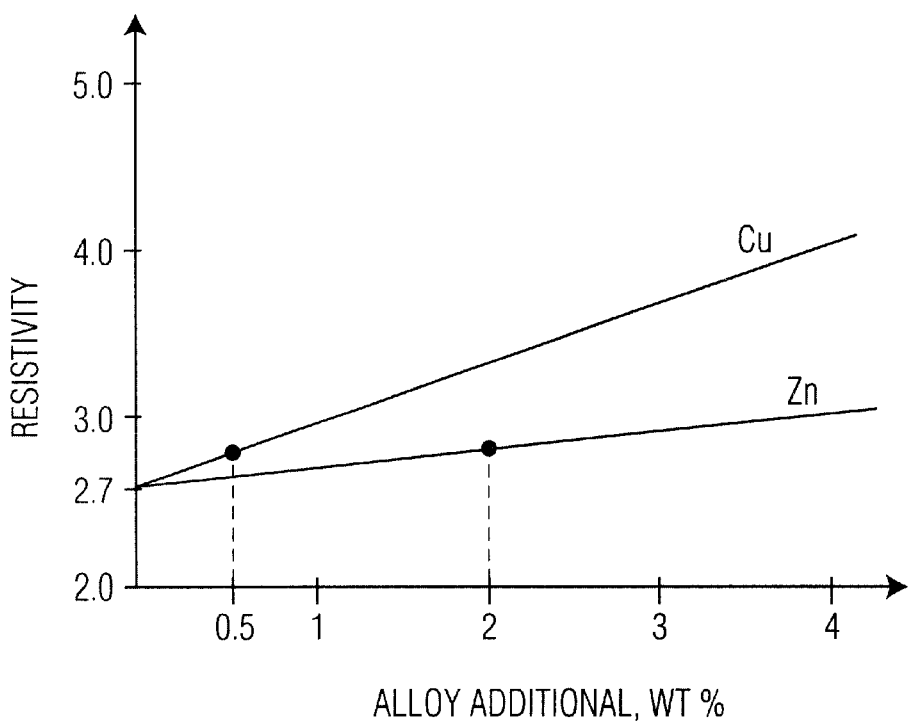
FIG. 6 is a graph of resistivity vs. additional alloy for Cu and Zn, illustrating the minor impact on resistivity with Zn additions to Al.

Further, FIG. 6 shows the relationship between resistivity in microohm-cm and additional alloy material (weight percentage). In a preferred exemplary embodiment, with about 2 weight percentage of Zn and 0.5 weight percentage of Cu, the values of resistivity for Zn and Cu are each about 2.8 microohm-cm, compared with that of pure aluminum which is about 2.7 microohm-cm. In these ranges of weight percentages of Cu and Zn, the resistivities are additive, such that the addition of the Zn to the Al—Cu alloy results in only a minor increase of about 0.1 microohm-cm. Thus, the total resistivity of the Al—Cu—Zn alloy remains relatively low.

FIG. 7 illustrates a cross section of a representative semiconductor device 51 having metallization lines 38. The device 51 includes a substrate 52 having oxide layers 53 and 54 thereon. A transistor device 56 is shown formed on the substrate 52 and including separate source-drain regions 57 and a polysilicon gate 58. A conductive contact 59 is provided in a hole that extends through the oxide layer 53. A first interconnect metallization line 38-1 of a metallization network 61 is formed over the oxide layer 53. The contact 59 extends between the line 38-1 and the polysilicon gate 58. The network 61 also includes a conductive via 62 extending between the one interconnect metallization line 38-1 and a second interconnect metallization line 38-2 deposited over the upper oxide layer 54. The interconnect metallization lines 38 may each be made from the Al—Cu—Zn alloy of the present invention by depositing the alloy on the oxide layers 53 and 54.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor device, comprising:
   a substrate;
   a plurality of interconnect metallization lines defined over the substrate, each of the interconnect metallization lines having an electromigration-impeding composition including a solid solution of aluminum and zinc grains of various sizes, the grains bounded by grain boundaries, the composition consisting essentially of,
   a percentage by weight of aluminum;
   a percentage by weight of copper; and
   a percentage by weight of zinc; and
   a precipitate of aluminum and copper defined in grain boundaries.

2. The semiconductor device as recited in claim 1, wherein the percentage by weight of zinc is less than about 4.

3. The semiconductor device as recited in claim 2, wherein the percentage by weight of copper is about 0.5.

4. The semiconductor device as recited in claim 1, wherein the percentage by weight of zinc ranges between about 1 and 2.

5. The semiconductor device as recited in claim 1, wherein electromigration of the aluminum from the grain boundaries occurs and tends to cause the aluminum to electromigrate from the grains, wherein the percentage by weight of zinc is selected to both define the solid solution with aluminum and to impede the electromigration of the aluminum from the grains.

6. A semiconductor device having improved interconnect metallization performance, comprising:
   at least one metallization layer, the metallization layer having grains of various sizes bounded by grain boundaries, the grains including a solid solution of aluminum and zinc, the grain boundaries including a precipitate of aluminum and copper such that electromigration tends to deplete the aluminum from the grain boundaries and cause migration of the aluminum from the grains, the zinc being effective to improve interconnect metallization performance by impeding the migration of the aluminum from the grains.

7. The semiconductor device as recited in claim 6, wherein the layer includes a percentage by weight of the aluminum; a percentage by weight of the copper; and a percentage by weight of the zinc, and wherein the percentage by weight of zinc is less than about 4.

8. The semiconductor device as recited in claim 7, further comprising:
   the percentage by weight of the zinc being selected to both define the solid solution with aluminum and to impede the electromigration of the aluminum from the grains without substantially increasing the resistivity of the metallization layer.

9. The semiconductor device as recited in claim 6, wherein the layer includes a percentage by weight of the aluminum; a percentage by weight of the copper; and a percentage by weight of the zinc, and wherein the percentage by weight of zinc ranges between about 1 and 2.

10. The semiconductor device as recited in claim 6, wherein the layer includes a percentage by weight of the aluminum; a percentage by weight of the copper; and a percentage by weight of the zinc, wherein the percentage by weight of zinc ranges between about 1 and 2, and wherein the percentage by weight of copper is about 0.5±0.4.

11. An interconnect metallization line composition having electromigration-impeding properties, the metallization line composition comprising:

a solid solution of aluminum and zinc, consisting essentially of:
   a percentage by weight of aluminum;
   a percentage by weight of copper; and
   a percentage by weight of zinc;
      the solid solution being in the form of various size grains, and the grains being bounded by grain boundaries; and
      a precipitate of aluminum and copper being defined in the grain boundaries.

12. The interconnect metallization line composition as recited in claim 11, wherein electromigration of the aluminum from the grain boundaries occurs and tends to cause the aluminum to electromigrate from the grains, wherein the percentage by weight of zinc both defines the solid solution with aluminum and impedes the electromigration of the aluminum from the grains.

13. The interconnect metallization line composition as recited in claim 12, wherein the percentage by weight of copper is about 0.5.

14. The interconnect metallization line composition as recited in claim 11, wherein the percentage by weight of zinc is less than about 4.

15. The interconnect metallization line composition as recited in claim 14, wherein the percentage by weight of zinc ranges between about 1 and about 2.

* * * * *